United States Patent
Vereecke et al.

(10) Patent No.: US 6,576,151 B1
(45) Date of Patent: Jun. 10, 2003

(54) ETCHING OF SILICON NITRIDE BY ANHYDROUS HALOGEN GAS

(75) Inventors: Guy Vereecke, Chastre (BE); Marc Meuris, Keerbergen (BE)

(73) Assignee: Internuiversitair Microelektronica Centrum, Leuven (BE)

( * ) Notice: Subject to any disclaimer, the term of this patent is extended or adjusted under 35 U.S.C. 154(b) by 137 days.

(21) Appl. No.: 09/656,041

(22) Filed: Sep. 8, 2000

(30) Foreign Application Priority Data

Sep. 10, 1999 (EP) .............................. 99870182

(51) Int. Cl.[7] .............................................. B44C 1/22
(52) U.S. Cl. ..................... 216/63; 216/74; 216/79; 216/99; 438/715; 438/724; 438/757
(58) Field of Search .................. 216/55, 67, 74, 216/63, 79, 99; 438/715, 724, 744, 757

(56) References Cited

U.S. PATENT DOCUMENTS

| | | | | |
|---|---|---|---|---|
| 4,657,616 A | * | 4/1987 | Benzing et al. | 118/50.1 |
| 4,789,440 A | * | 12/1988 | Mahr et al. | 205/82 |
| 4,820,378 A | * | 4/1989 | Loewenstein | 204/192.37 |
| 5,279,705 A | * | 1/1994 | Tanaka | 438/707 |
| 5,420,078 A | | 5/1995 | Sikora | 437/228 |
| 5,534,107 A | | 7/1996 | Gray et al. | 156/643.1 |
| 6,284,666 B1 | * | 9/2001 | Naeem et al. | 438/713 |

FOREIGN PATENT DOCUMENTS

| | | |
|---|---|---|
| EP | 0 590 876 A2 | 4/1994 |
| EP | 0 706 206 A2 | 4/1996 |
| GB | 2062689 A * | 5/1981 ............. C23G/5/00 |

OTHER PUBLICATIONS

Meuris, et al.: "*The Imec Clean: a new concept for particle and metal removal on Si surfaces*"; Solid State Technology; Jul.; p. 109 (1995).

Heyns, et al.: "*New Wet Cleaning Strategies for Obtaining Highly Reliable Thin Oxides*"; Soc. Symp. Proc. vol. 315, p. 35 (1993).

* cited by examiner

*Primary Examiner*—Anita Alanko
(74) *Attorney, Agent, or Firm*—Knobbe Martens Olson & Bear LLP

(57) ABSTRACT

The present invention discloses a method for removing silicon nitride from a substrate, characterised in that it comprises contacting said substrate with a molten halogen salt.

10 Claims, 6 Drawing Sheets

US 6,576,151 B1

ETCHING OF SILICON NITRIDE BY ANHYDROUS HALOGEN GAS

FIELD OF THE INVENTION

Figure 1A:
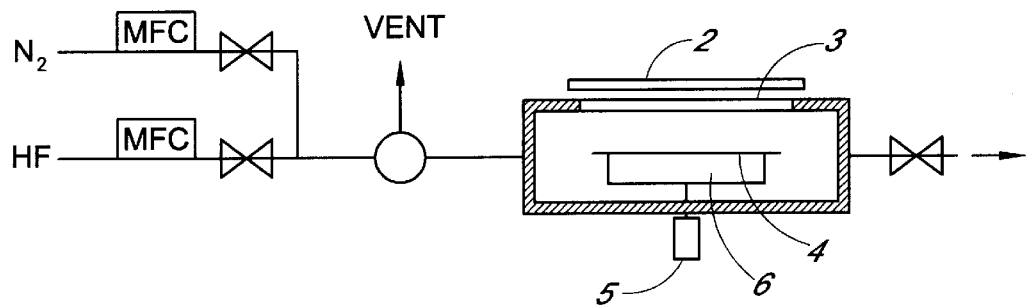

The field of the present invention relates to etching of silicon nitride and/or silicon oxide by anhydrous HF.

1. State of the Art

Existing solutions for etching comprise aqueous solution etching, plasma etching and others such as nonaqueous solution etching and plasmaless gas phase etching.

Methods for etching $Si_3N_4$ are described in several documents. U.S. Pat. No. 5,534,107 describes a method for removing silicon nitride from a substrate. The substrate (being silicon or silicon oxide) is placed in a gaseous environment comprising a fluorine comprising gas which can be photodissociated using UV-radiation. EP 0590876 describes a selective silicon nitride etch (with respect to silicon oxide) using an etch bath comprising phosphoric acid, nitric acid and hydrofluoric acid. EP 0706206 describes a method for selectively etching $Si_3N_4$ to $SiO_2$. A plasma etch system comprising $CF_4$, $O_2$ and Ar is used.

The document U.S. Pat. No. 5,420,078 describes a method for forming via holes in a dielectric layer such as an $Si_3N_4$ or $SiO_2$ layer using an acidic vapour at room temperature and atmospheric pressure.

2. Aims of the Invention

The present invention aims at providing a new method for etching silicon nitride and/or silicon oxide effectively from a silicon wafer substrate. A further aim of the present invention is to provide a means for selectively etching silicon nitride in the presence of silicon oxide layers.

SUMMARY OF THE INVENTION

The invention comprises a method for removing silicon nitride from a substrate by etching, characterised in that it comprises the following steps:

bringing the surface temperature of said substrate to at least 125° C., and contacting said substrate with anhydrous hydrogen halognide, and characterised in that the silicon nitride etching rate is at least 20 nm/min.

Said method can be further characterised in that the pressure while etching lies between 10 and 760 torr. Preferably, the substrate surface temperature while etching lies between 125 and 300° C. Further, said hydrogen halogenide is preferably chosen from the group consisting of HF and HCl.

The method of the invention can further comprise the following steps:

loading a substrate in a process chamber;

heating up said substrate to process temperature while pumping the chamber down to vacuum;

etching of silicon nitride at constant process temperature, by filling said process chamber with HF until the target pressure is reached;

vaporization of the reaction product;

cooling down the wafer filling the chamber to atmospheric pressure with $N_2$; and unloading said substrate.

In a preferred embodiment, the substrate is a silicon wafer.

The method can further be characterised in that it comprises the formation of a halogen salt, The method is is characterised in that the molten halogen salt is an ammonium salt.

Said molten halogen salt is preferably an ammonium salt. Further, said halogen is preferably chosen from the group consisting of F and Cl.

In an advantageous embodiment, said salt is selected from the group consisting of $(NH_4)_2SiF_6$, $NH_4HF_2$, $NH_4HF$ and $NH_4Cl$.

Preferably, said salt is formed by reaction of HF and/or HCl with $Si_3N_4$.

SHORT DESCRIPTION OF THE DRAWINGS

Figure 1B:
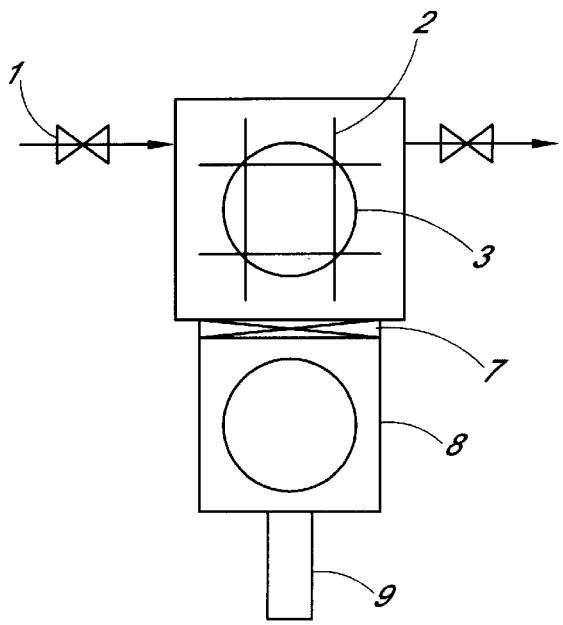

FIG. 1 describes a schematic diagram of the vapor phase cleaning tool: cross-section (a) and top view (b). MFC is for Mass Flow Controller.

Figure 2:
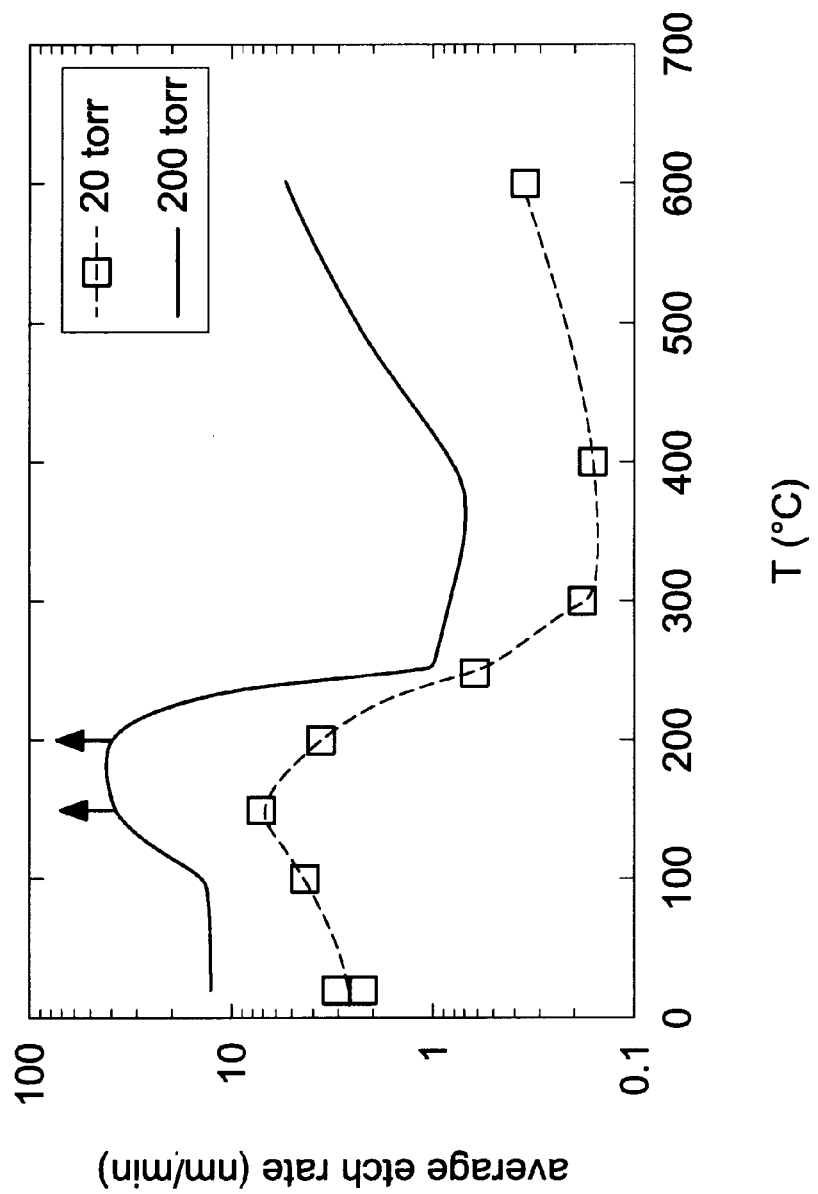

FIG. 2 shows the average etch rate of silicon nitride by anhydrous HF as a function of wafer temperature at a set pressure of 20 and 200 torr. Process time including chamber fill was 5 min (2 min at 600° C.). HF flow rate was 0.5 SLM (Standard Liter per Minute). Symbols with arrow indicate estimated lower values in the case of complete etching of the nitride layer.

Figure 3:
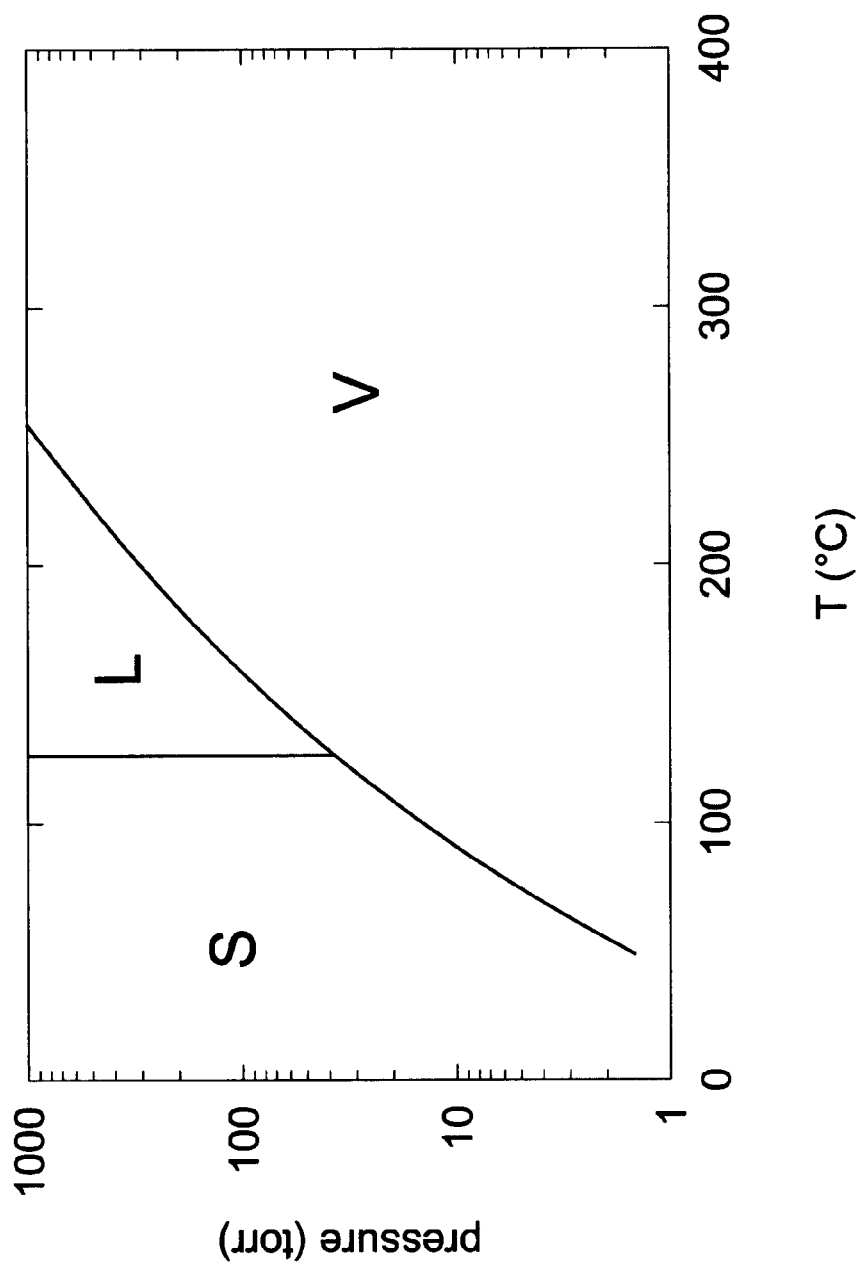

FIG. 3 depicts an approximate phase diagram for $NH_4HF_2$ based on available thermodynamical data and Clausius-Clapeyron equation (see detailed description of the invention) showing the conditions where the compound is a solid (S), a liquid (L), and a vapor (V).

Figure 4:
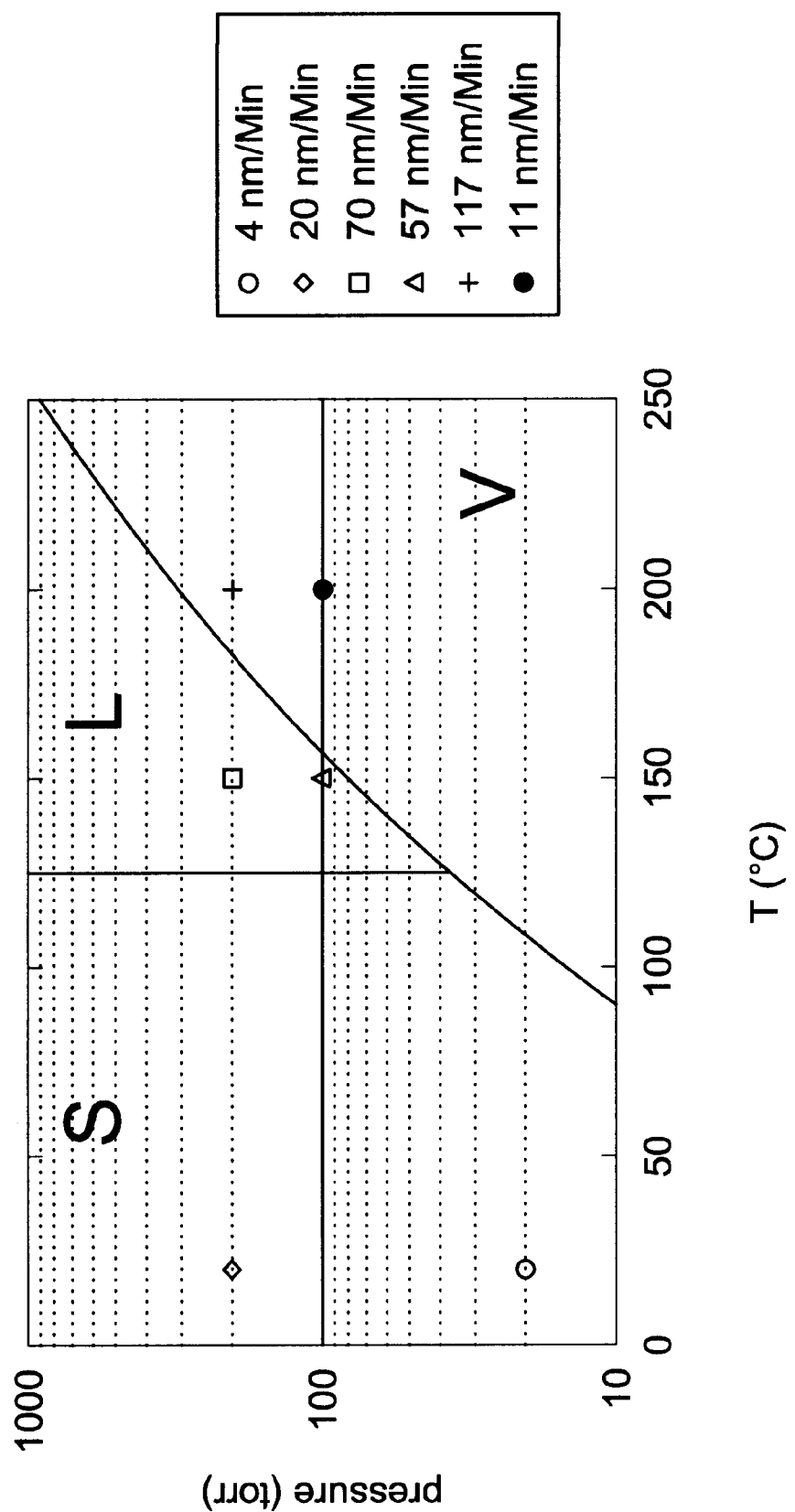

FIG. 4 describes the average etch rate (nm/min) of silicon nitride by anhydrous HF at constant temperature and pressure, superposed on the phase diagram of $NH_4HF_2$ (see FIG. 3). Process was performed after chamber fill for 1 min. Wafer temperature was 20, 150 and 200° C.; pressure was 20, 100 and 200 torr. HP flow rate was 0.5 SLM.

Figure 5:
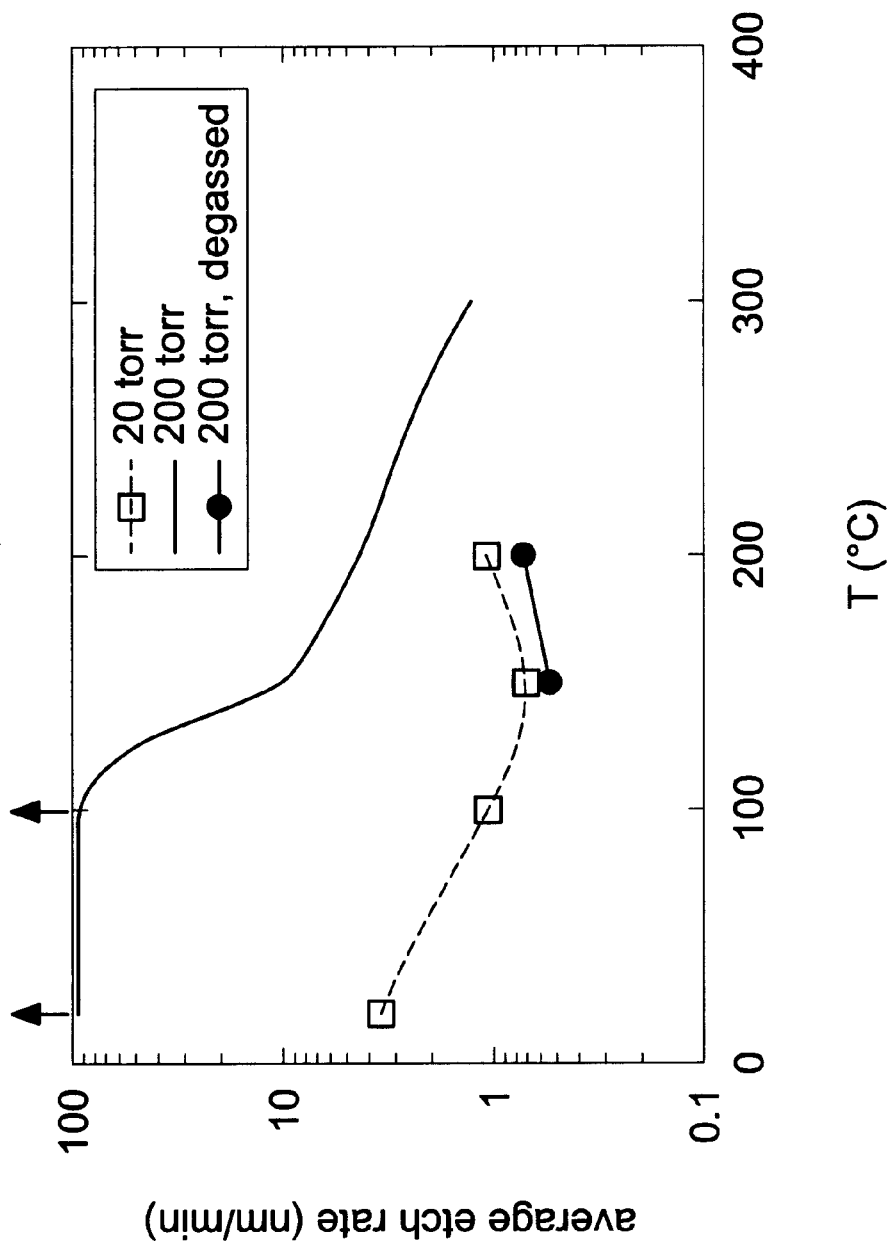

FIG. 5 depicts the average etch rate of silicon dioxide bar anhydrous HF as a function of wafer temperature at a set pressure of 20 and 200 torr. Process time including chamber fill was 5 min (2 min at 600° C.). HF flow rate was 0.5 SLM. Symbols with arrow indicate estimated lower values in the case of complete etching of the oxide layer. Full symbols are for wafers degassed at 400° C. for 5 min before processing.

Figure 6:
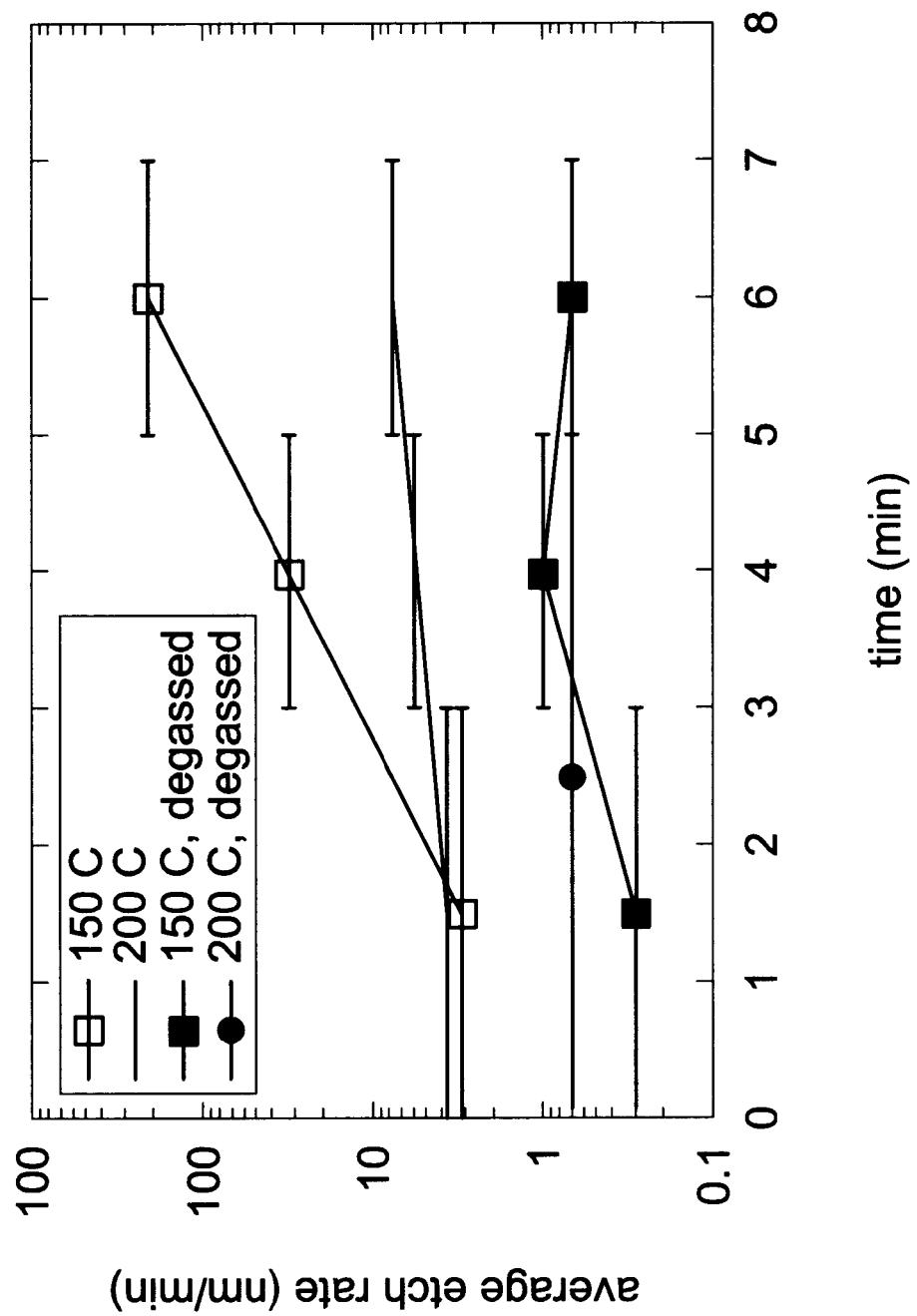

FIG. 6 shows the influence of wafer degassing on the average etch rate of silicon dioxide by anhydrous HF as a function of process time (including chamber fill). Wafer temperature of 150 and 200° C., pressure of 200 torr, HF flow rate of 0.5 SLM. Error bars give the time span of average values.

DETAILED DESCRIPTION OF THE INVENTION

The method according to the present invention and as used in the following examples was performed in a commercially available vapor phase cleaning tool, Primaxx from SubMicron Systems Inc. (FIG. 1). Wafers are loaded into the chamber using a load lock (8) equipped with a gate valve (7) and a wafer manipulator (9). The silicon wafer (4) is suspended on alumina pins (6) in an alumina reactor and is rotated using the wafer rotator (5) during processing. An alumina diffuser plate ensures adequate gas distribution and a saphire window (3) above the wafer allows fast wafer heating by power controlled IR illumination normal to the wafer surface. The process gas flow (through input flow vent 1) is parallel to the wafer surface. Gas flows, chamber pressure, IR power and process times are computer controlled. The chamber walls were heated at 26° C. to prevent HF condensation. An online wafer temperature control was not possible in the experiments. The wafer temperature is estimated from temperature calibrations made with a 6" thermocouple Si wafer from Sense Array at 760 Torr chamber pressure. Unless stated otherwise the process recipe consisted of the following steps:

(1) loading a wafer in the process chamber;
(2) heating up the wafer to process temperature while pumping the chamber down to vacuum; at the same time an HF flow of 200 SCCM (standard cubic centimeter per minute) is routed to the vent to purge the line; step duration was 30 s;
(3) etching of silicon nitride at constant temperature: the chamber is filled with HF (500 SCCM, the maximum flow possible) until the set pressure is reached; the step time was variable;
(4) vaporization of the reaction product by heating the wafer up to 300° C. in 30 s and holding for 1 min (pressure was 30 torr under 5 SLM (standard liter per minute) of $N_2$);
(5) pump purge: 3 cycles of 15 s with pressure varying between vacuum and 20 torr $N_2$;
(6) cooling down the wafer: 2 min under 5 SLM $N_2$ at 100 torr;
(7) filling the chamber to atmospheric pressure with $N_2$;
(8) unloading the wafer.

Wafers with silicon dioxide layers were sometimes degassed in-situ at 400° C. for 5 min before processing. Silicon nitride blanket films of thickness varying between 100 and 300 nm were deposited on 150 mm p-type <100> silicon wafers by LPCVD from a mixture of $NH_3$, DCS (dichlorosilane) and $N_2$ in an ASM DFS-250 horizontal furnace and an ASM Advance A400 vertical furnace. Prior to deposition wafers received an IMEC clean (see M. M Heyns, S. Verhaverbeke, M;. Meuris, P. W. Mertens, H. Schmidt, M. Kubota, A. Philipossian, K. Dillenbeck, D.Graf, A. Schnegg, and R. De Blank. Mater. Res. Soc. Symp. Proc. 315, p. 35 (1993) and M. Meuris, P. W. Mertens, A. Opdebeeck, H. F. Schmidt, M. Depas, G. Vereecke, M. M. Heyns,. and A. Philipossian, Solid State Technol., July, p. 109 (1995).). The layers thickness was measured by ellipsometry (KLA-Tencor F5).

EXAMPLE 1

Etching of Silicon Nitride

FIG. 2 gives the average etch rate of silicon nitride by anhydrous HP as a function of wafer temperature at a set pressure of 20 and 200 torr. The initial thickness of the nitride layer was 200 nm. Symbols with arrow indicate estimated lower values in the case of complete etching of the nitride layer. Process time was 5 min except at 600° C. where it was only 2 min. HF flow rate was 0.5 SLM. The time for chamber fill, which is included in the process time, was about 18 s and 180 s for a set pressure of 20 and 200 torr, respectively.

FIG. 2 shows dramatic changes of the etch rate of silicon nitride as a function of temperature at both pressures. The highest etch rates (above 50 nm/min) are encountered when processing at 200 torr HF at temperatures of 150 and 200° C. In this case, when process recipe did not include the vaporization step (4), a white solid residue wag found at the surface of the wafer at the end of the process. Residues from several wafers were collected and analysed by X-ray diffraction (XRD), indicating that the residue is composed of ammonium fluosilicate $(NH_4)_2SiF_6$. Hence the following reaction can be proposed for the etching of silicon nitride by anhydrous HF:

$$Si_3N_4(s)+16HF(g) \rightarrow 2(NH_4)_2SiF_6+SiF_4(g) \qquad [1]$$

$(NH_4)_2SiF_6$ is a solid under normal conditions. The high changes of the etch rate as a function of temperature suggest that etching kinetics are influenced by the physical state of the reaction product. The etch rate at temperatures below 100° C. would be controlled by the diffusion of HF through a solid layer of reaction product and the vaporization rate of this layer ('solid' regime). The higher etch rate at temperatures of about 100 to 300° C. would be due to the presence of a liquid layer of reaction product on top of the unreacted nitride layer ('liquid' regime). The reaction product would be a vapor at temperatures above about 300° C. ('vapor' regime). In these conditions the etch rate would depend on the adsorption efficiency of HF on the nitride surface, which decreases as temperature increases, and the positive effect of higher temperature on reaction kinetics.

The knowledge of the phase diagram of $(NH_4)_2SiF_6$ would be of great help to define process conditions. However thermodynamical data on this compound could not be found. Fluosilicates are reported to decompose upon heating with release of gaseous silicon tetrafluoride and formation of the solid fluoride (Ullmann's Encyclopedia of Industrial Chemistry, 5th Ed., VCH, vol. A 11 (1988) p. 336). The most stable ammonium-fluorine salt is $NH_4HF_2$ (Ullmann, p. 329), giving the following reaction for the decomposition of $(NH_4)_2SiF_6$:

$$(NH_4)_2SiF_6 \rightarrow NH_4HF_2+SiF_4(g)+NH_3(g) \qquad [2]$$

In absence of data on $(NH_4)_2SiF_6$ the phase diagram of $NH_4HF_2$ may be useful, particularly at higher temperatures. FIG. 3 shows an approximate phase diagram for $NH_4HF_2$. It is based on available thermodynamical data (at atmospheric pressure melting point $T_m=126.1°$ C. and boiling point $T_b=239.5°$ C., ref Ullmann p. 329) and Clausius-Clapeyron equation. The heat of vaporization at atmospheric pressure was estimated using Trouton's rule and assumed to be independent of temperature. FIG. 3 shows the conditions where the compound is a solid (S), a liquid (L), a vapor (V), and the lines where phases transformations occur. The S-L line was assumed to be vertical at the temperature $T_m$ while it is expected to present a steep positive slope.

FIG. 4 gives the average etch rate (nm/mn) of silicon nitride by anhydrous HF at constant temperature and pressure, superposed on the phase diagram of $NH_4HF_2$. Chamber fill was performed at room temperature; then the wafer was heated up to process temperature which was held for 1 min. Results in FIG. 4 are average etch rates over that 1 min etching under constant temperature and pressure. They were obtained by subtracting the thickness etched during chamber fill and temperature ramp-up determined separately from the total thickness etched at high temperature. The etch rate values displayed in FIG. 4 are considered to be more representative of values that could be obtained in a production tool with fast filling of the chamber to the set pressure.

During processing part of the reaction product is condensing in the chamber and particularly on the window. Consequently the wafer temperature is not accurate any more after processing a few wafers because of absorption of IR light in the layer condensed on the window and a chamber clean is needed. A water rinse was sufficient to remove products condensed on the window. A possible solution to these problems would be to perform this process in a tool of the hot wall type. Considering that the boiling point of $NH_4HF_2$ is 239.5° C., a wall temperature of about 250° C. should be sufficient to prevent any condensation during processes performed at subatmospheric pressure. Condensation of reaction products in the exhaust of the process tool should also be considered during the design of a tool.

EXAMPLE 2

Etching of Silicon Dioxide

Etching of silicon dioxide by HF in the vapor phase has already been studied. Reaction occurs as follow:

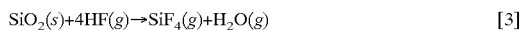
$$SiO_2(s)+4HF(g) \rightarrow SiF_4(g)+H_2O(g) \quad [3]$$

The reaction is catalyzed by $H_2O$, i.e. it is autocatalytic. Hence the etching rate is not constant over time.

FIG. 5 gives the average etch rate of silicon dioxide by anhydrous HF as a function of wafer temperature under conditions similar to those used for the etching of silicon nitride (FIG. 2). The initial thickness of the oxide layers was about 450 nm. The etch rate is much higher at 200 torr compared to 20 torr. The etch rate at 200 torr decreases dramatically as the temperature increases. This is likely to result from the enhanced desorption of water and the decreased adsorption of HF as the temperature increases. The decreased average etch rate for degassed wafers illustrates the high influence of water present initially at the wafer surface.

The tremendous influence of water and the autocatalytic character of the reaction is further illustrated in FIG. 6 where the average etch rate of silicon dioxide is given as a function of time for both non-degassed and degassed wafers.

EXAMPLE 3

Selective Etching of Silicon Nitride

From the above, when processing at 200 torr in the 'liquid' regime high etch rates of silicon nitride (70 to 120 nm/min) can be obtained with a high selectivity to silicon dioxide (about 100:1). Lower etch rates (between about 1 and 10 nm/min at 200 torr) and selectivity (down to about 1:1 at 200 torr) are obtained in the 'solid' and 'vapor' regimes.

Variations to the Method According to the Invention:

A possible alternative process, still according to the present invention, is to stop etching in the 'liquid' regime before complete etching of the nitride layer, leaving a few nm of nitride, and end nitride etching either in the 'solid' regime or in the 'vapor' regime.

Other Halogens can be used, e.g. Cl:

$$Si_3N_4(s)+16HCl(g) \rightarrow 4NH_4Cl+3SiCl_4(g) \quad [4]$$

$NH_4Cl$ presents higher melting and boiling points than $NH_4HF_2$. Possible advantages: (1) HCl does not etch silicon dioxide; (2) simultaneous removal of metallic impurities as many metallic chlorides are relatively volatile (more than the fluorides).

Further, the vaporization step (4) in the recipe can be replaced by a sublimation step: removal of residues by decreasing the temperature to solidify the reaction product, then decreasing pressure, and then increasing the temperature again to cross the S-V line.

In the 'liquid' regime, one could continuously remove the reaction product by cycling between etch conditions and vaporization or sublimation conditions. Cycling between etch conditions and vaporization conditions could be done just by temperature cycling. Cycling between etch conditions and sublimation conditions would imply a more complex cycle.

What is claimed is:

1. Method for removing silicon nitride from a substrate by etching, comprising the following steps:

bringing the surface temperature of said substrate to at least 125° C., and contacting said substrate with anhydrous hydrogen halogenide at a target pressure such that a reaction of the anhydrous halogenide and the silicon nitride yields a molten halogen salt, wherein the silicon nitride etching rate is at least 20 nm/min.

2. The method as in claim 1, wherein the hydrogen halogenide is chosen from the group consisting of HF and HCl.

3. The method as in claim 1 wherein the pressure while etching is less than or equal to 760 torr.

4. The method as in claim 1, wherein the substrate surface temperature while etching lies between 125 and 300° C.

5. The method as in claim 1, further comprising the following steps:

loading a substrate in a process chamber;

heating up said substrate to process temperature while pumping the chamber down to vacuum;

etching of silicon nitride at constant process temperature, by filling said process chamber with HF until the target pressure is reached;

vaporization of the reaction product;

cooling down the wafer;

filling the chamber to atmospheric pressure with $N_2$; and unloading said substrate.

6. The method as in claim 1 wherein the substrate is a silicon wafer.

7. The method as in claim 1, wherein the molten halogen salt is an ammonium salt.

8. The method as in claim 1, wherein the halogen is chosen from the group consisting of F and Cl.

9. The method as in claim 1, wherein the salt is selected from the group consisting of $(NH_4)_2SiF_6$, $NH_4HF_2$, $NH_4HF$, and $NH_4Cl$.

10. The method as in claim 9, wherein the salt is formed by reaction of HF and/or HCl with $Si_3N_4$.

* * * * *